(12) United States Patent  
Brearley et al.

(10) Patent No.: US 8,584,060 B1  
(45) Date of Patent: Nov. 12, 2013

(54) BLOCK MASK DECOMPOSITION FOR MITIGATING CORNER ROUNDING

(71) Applicant: International Business Machines Corporation, Armonk, NY (US)

(72) Inventors: William Brearley, Poughkeepsie, NY (US); Geng Han, Fishkill, NY (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/679,115

(22) Filed: Nov. 16, 2012

(51) Int. Cl.
*G06F 17/50* (2006.01)

(52) U.S. Cl.
USPC .......... 716/55; 716/50; 716/51; 716/52; 716/53; 716/54; 430/5; 430/30

(58) Field of Classification Search
USPC .................................. 716/50–56; 430/5, 30
See application file for complete search history.

(56) References Cited

U.S. PATENT DOCUMENTS

| | | | | |
|---|---|---|---|---|
| 6,077,310 | A * | 6/2000 | Yamamoto et al. | 716/53 |
| 6,613,485 | B2 * | 9/2003 | Huang et al. | 430/5 |
| 8,026,179 | B2 | 9/2011 | Lue | |
| 2003/0027058 | A1 * | 2/2003 | Kato | 430/5 |
| 2005/0076316 | A1 * | 4/2005 | Pierrat et al. | 716/4 |
| 2007/0172770 | A1 | 7/2007 | Witters et al. | |
| 2009/0199137 | A1 * | 8/2009 | Huckabay et al. | 716/4 |
| 2010/0021055 | A1 | 1/2010 | Socha | |
| 2010/0023914 | A1 * | 1/2010 | Sahouria et al. | 716/19 |
| 2010/0167548 | A1 | 7/2010 | Kim | |
| 2011/0014786 | A1 | 1/2011 | Sezginer et al. | |
| 2011/0113393 | A1 | 5/2011 | Sezginer | |
| 2011/0197168 | A1 * | 8/2011 | Chen et al. | 716/50 |
| 2012/0110521 | A1 | 5/2012 | Agarwal et al. | |

OTHER PUBLICATIONS

Leen, T.K., "Theory and Practice of Proximity Correction by Secondary Exposure" Journal of Applied Physics (Feb. 1989) pp. 1776-1781, vol. 65, No. 4.

Laidler, D., "Identifying Sources of Overlay Error in FinFET Technology" Proc. SPIE Metrology, Inspection, and Process Control for Microlithography XIX (2005) pp. 80-90, vol. 5752.

Kahng, A.B. et al., "Layout Decomposition Approaches for Double Patterning Lithography" IEEE Transactions on Computer-Aided Design of Integrated Circuits and Systems (Jun. 2010) pp. 1-16, vol. 29, No. 6.

(Continued)

*Primary Examiner* — Nha Nguyen

(74) *Attorney, Agent, or Firm* — Scully, Scott, Murphy & Presser, P.C.; Yuanmin Cai

(57) ABSTRACT

A method for decomposing design shapes in a design level into a plurality of target design levels is provided. Design shapes including first-type edges and second-type edges having different directions is provided for a design level. Inner vertices are identified and paired up. Vertices are classified into first-type vertices and second-type vertices. First mask level shapes are generated so as to touch the first-type vertices, and second mask level shapes are generated so as to tough the second-type vertices. Cut mask level shapes are generated to touch each first-type edges that are not over a second-type edge and to touch each second-type edges that are not over a first-type edge. Suitable edges are sized outward to ensure overlap among the various shapes. The design shapes are thus decomposed into first mask level shapes, the second mask level shapes, and the cut mask level shapes.

20 Claims, 15 Drawing Sheets

(56) References Cited

OTHER PUBLICATIONS

Liebmann, L. et al., "Taming the final frontier of optical lithography: Design for sub-resolution patterning" Proceedings of the SPIE (2010) pp. 764105-1-764105-11, vol. 7641.

Zhang, H. et al., "Characterization and Decomposition of Self-Aligned Quadruple Patterning Friendly Layout" Proceedings of SPIE, Optical Microlithography XXV (Feb. 13-16, 2012) pp. 83260E-1-83260E-11, vol. 8326.

Ghaida, R.S. et al., "O(n) Layout-Coloring for Multiple-Patterning Lithography and Conflict-Removal Using Compaction" 2012 IEEE international Conference on IC Design & Technology (ICICDT) (May 30-Jun. 1, 2012) 4 pages.

* cited by examiner

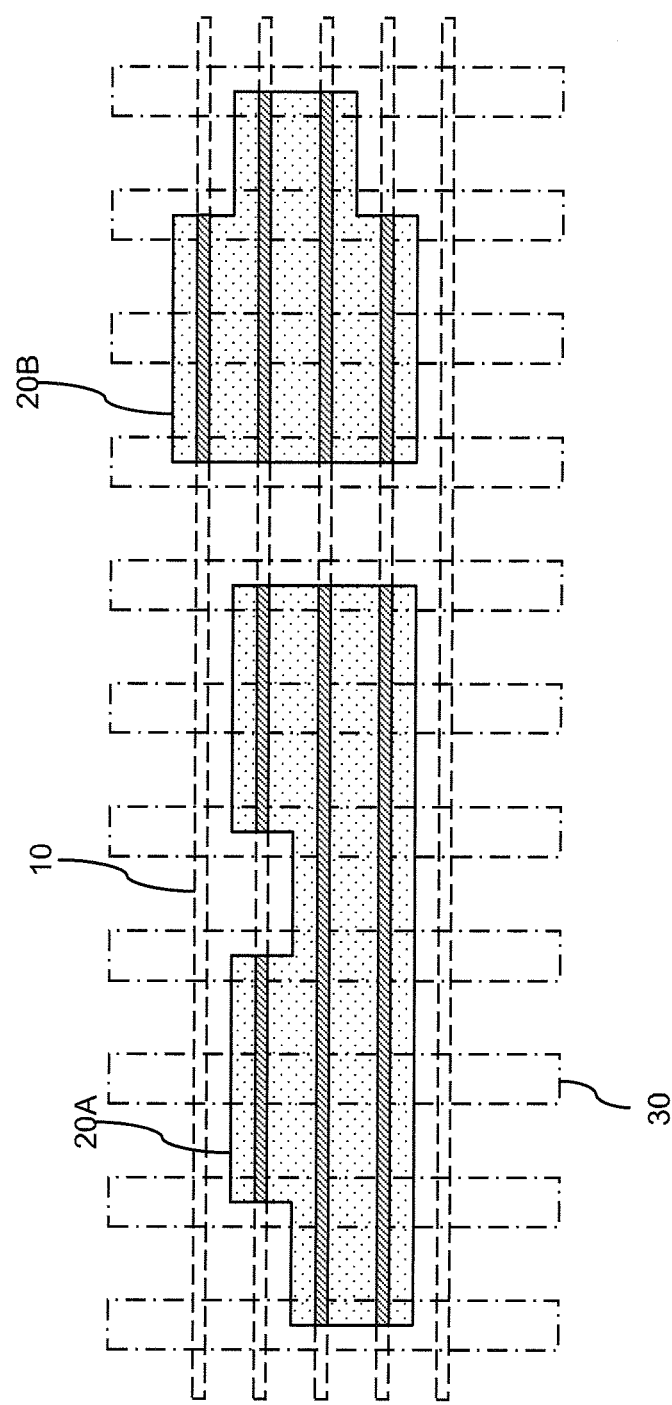

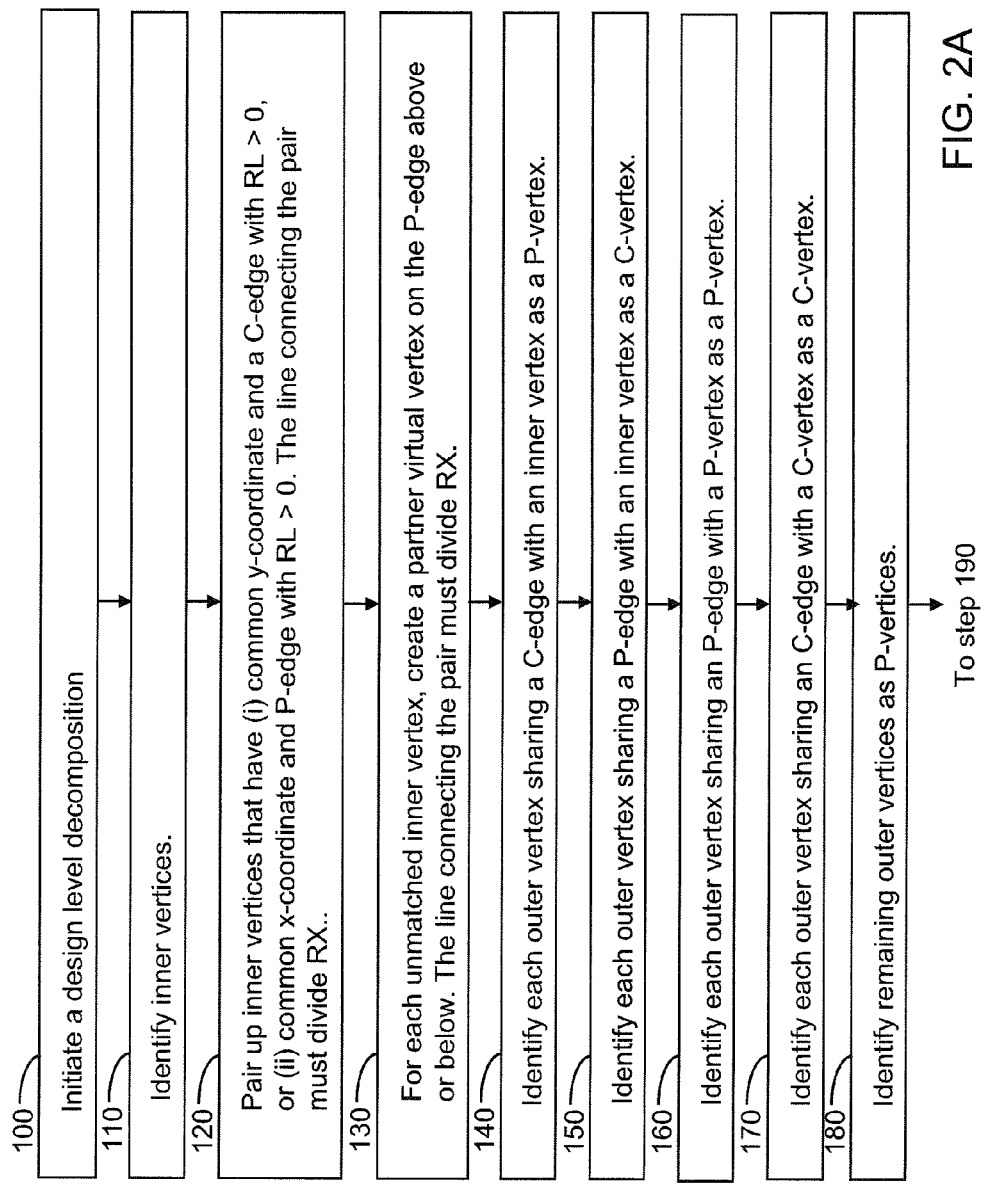

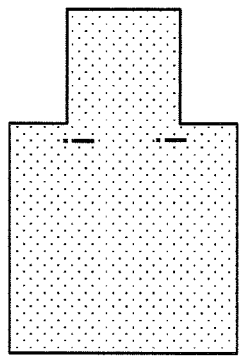
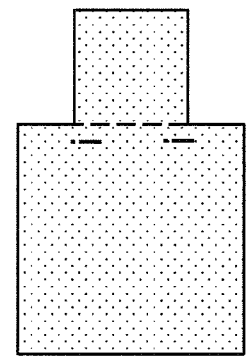
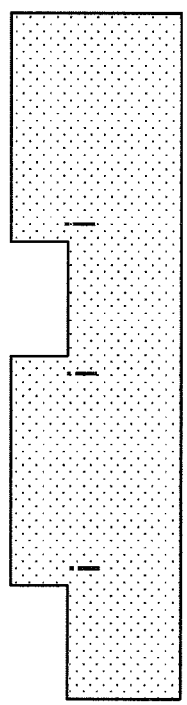
FIG. 3
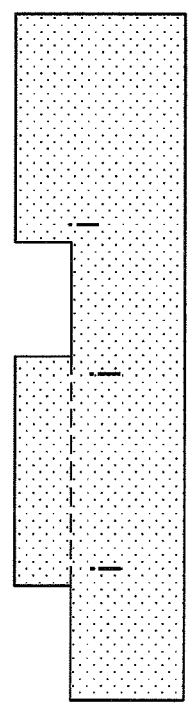
FIG. 4

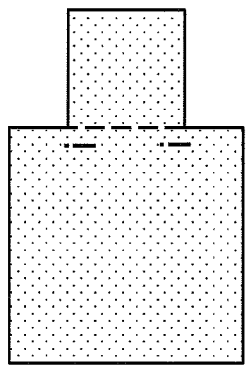
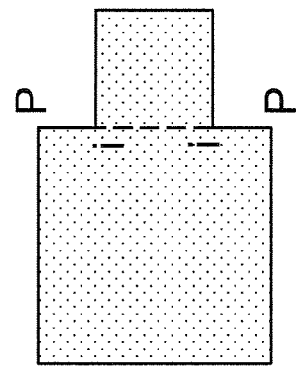
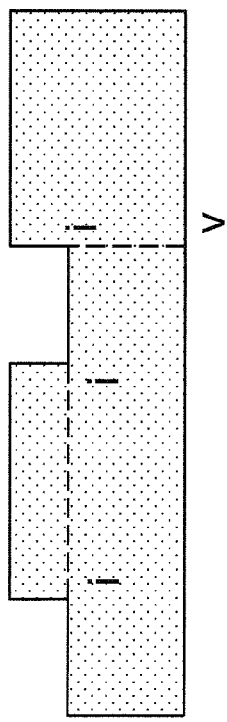
FIG. 5
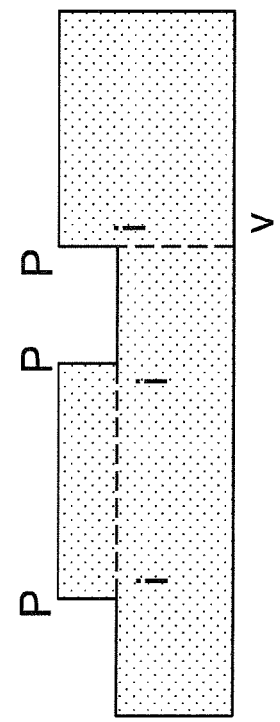
FIG. 6

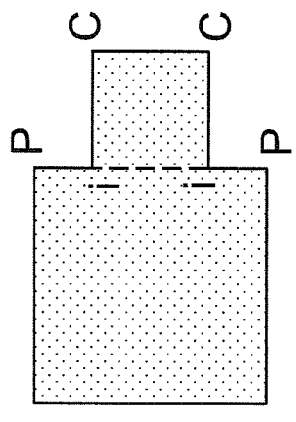
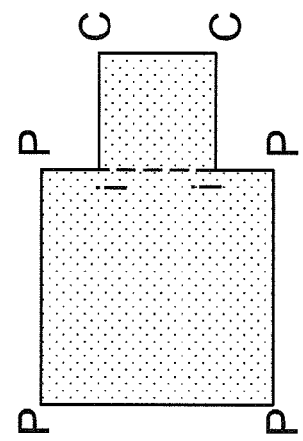
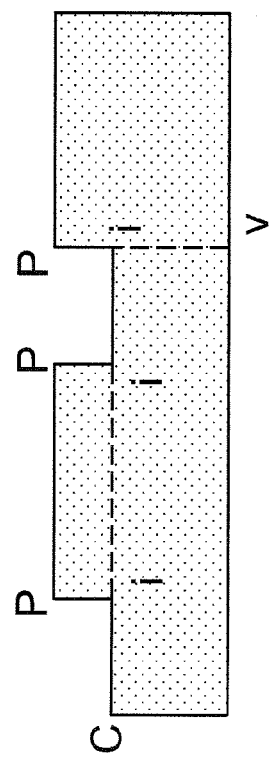
FIG. 7
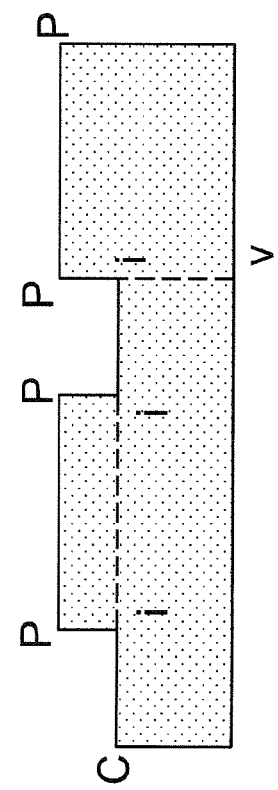
FIG. 8

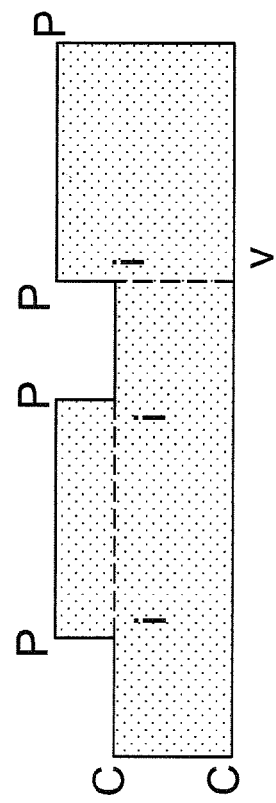
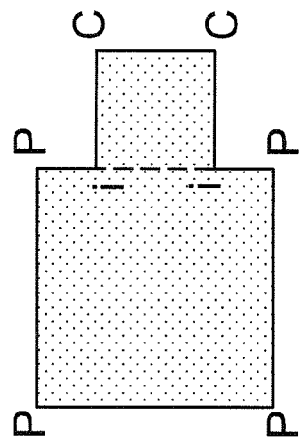
FIG. 9
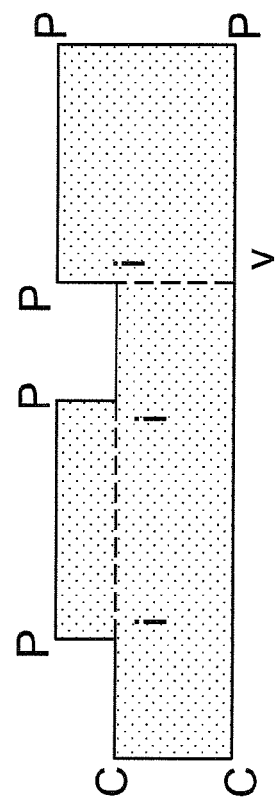
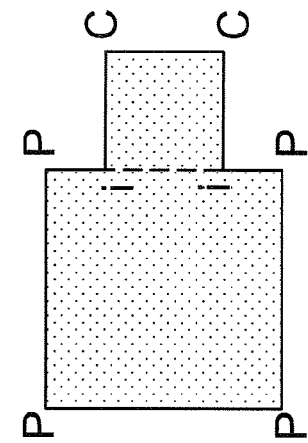
FIG. 10

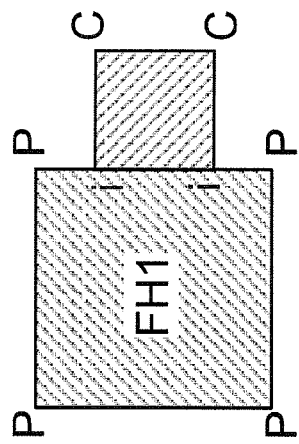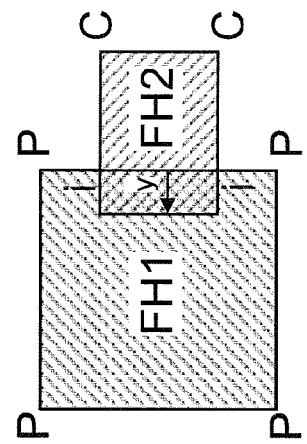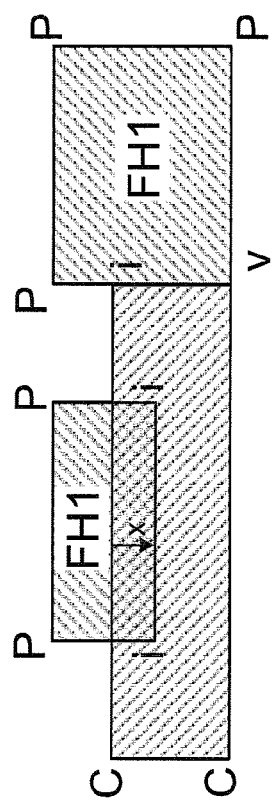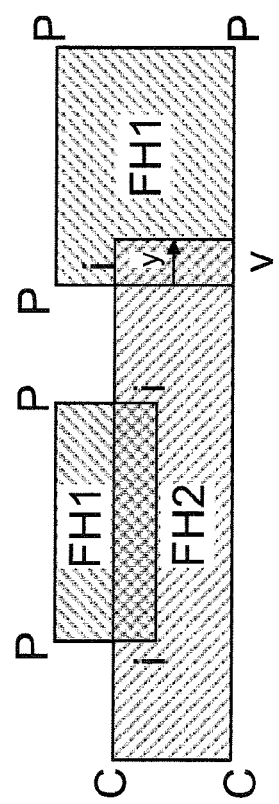
FIG. 13　　　FIG. 14

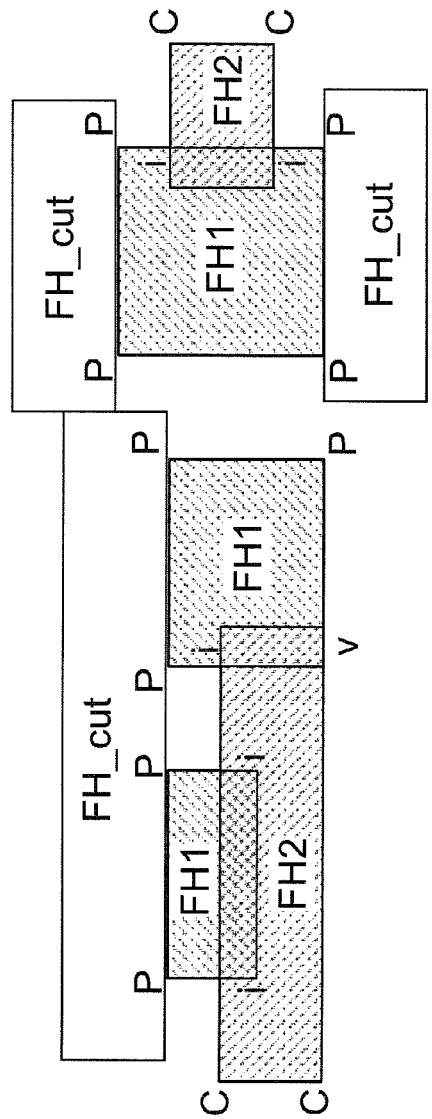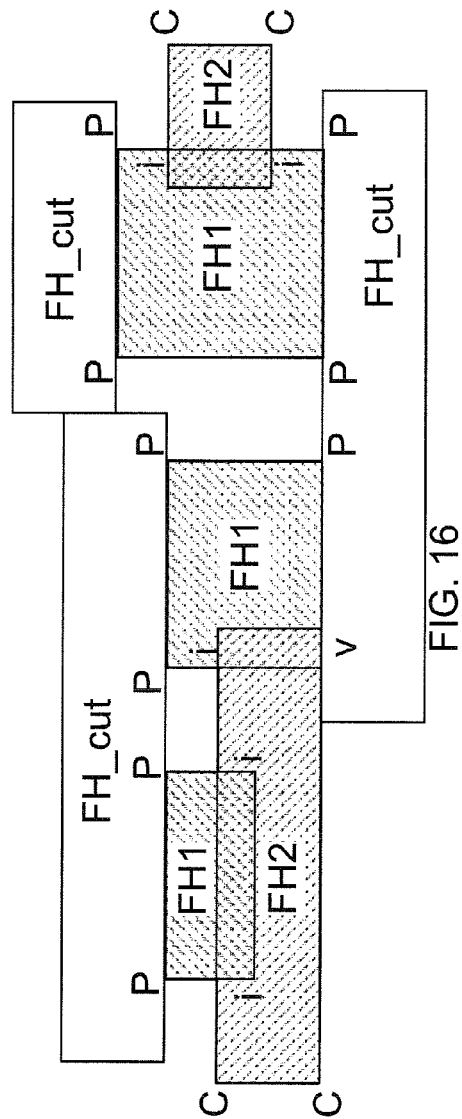

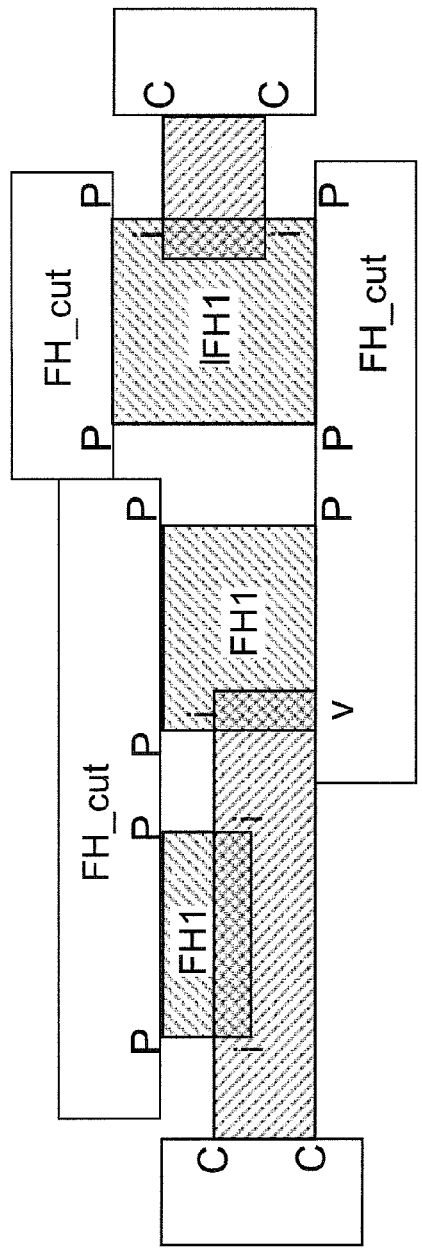
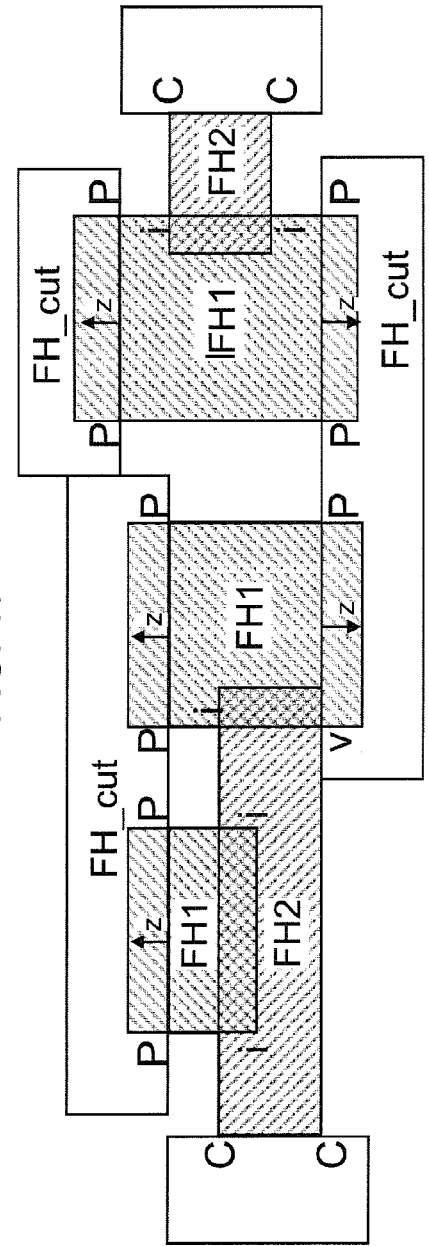
FIG. 17
FIG. 18

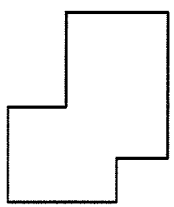
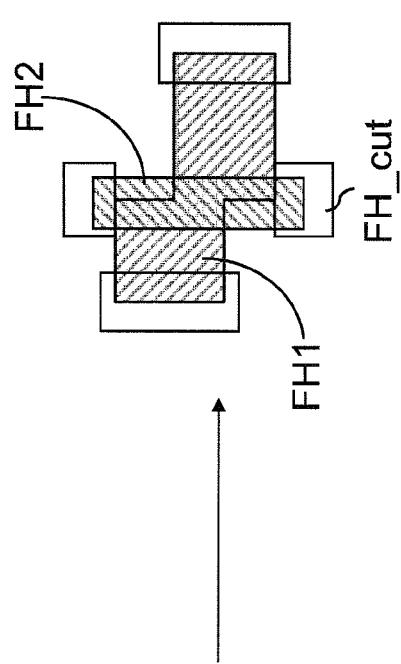
FIG. 20
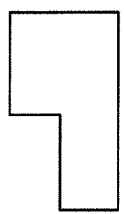
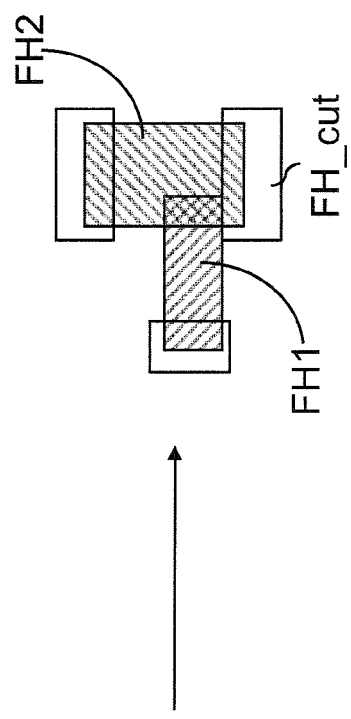
FIG. 21

BLOCK MASK DECOMPOSITION FOR MITIGATING CORNER ROUNDING

BACKGROUND

The present disclosure relates to a method of designing a set of masks for a lithographic level, and more particularly to a method of decomposing shapes in a lithographic level into multiple sets of shapes corresponding to multiple lithographic masks, and an apparatus for implementing the same.

The ability to lithographically define shapes without the effect of corner rounding or other optical-proximity related effects is paramount as the features of semiconductor devices continue to shrink and as the overlay tolerance of lithographic tools and the ability of optical proximity correction to compensate for proximity effect are limited. For example, in a manufacturing scheme in which a "sea of fins" is first formed and unwanted portions of the fins are subsequently removed, the ability to form straight edges in the cut fins is critical in order to avoid formation of unwanted device features (such as deposition of unwanted semiconductor materials during a selective epitaxy process). Further, when the number of semiconductor fins needs to be reduced in order to provide devices having different on-currents, optical proximity effects can move the edge of a lithographically exposed and developed photoresist layer away from target locations and cause inclusion of an additional semiconductor fin or unwanted removal of a semiconductor fin. Thus, a method for printing a lithographic pattern with minimal impact due to optical proximity effects is desired.

SUMMARY

A method for decomposing shapes in a design level into a plurality of levels is provided. Design shapes including first-type edges and second-type edges having different directions is provided for a design level. Inner vertices are identified and paired up. For each unmatched inner vertex, a partner virtual vertex can be created on a first-type edge of a shape. Each outer vertex sharing a second-type edge or a first-type edge with any inner vertex is identified as a first-type vertex or a second-type vertex, respectively. Each outer vertex sharing a first-type edge with a first-type vertex is identified as another first-type vertex, and each outer vertex sharing a second-type edge with a second-type vertex is identified as another second-type vertex. Remaining outer vertices are identified as first-type vertices. First mask level shapes are generated so as to touch the first-type vertices, and second mask level shapes are generated so as to tough the second-type vertices. Cut mask level shapes are generated to touch each first-type edges that are not over a second-type edge and to touch each second-type edges that are not over a first-type edge. Suitable edges are sized outward to ensure overlap among the various shapes. The first mask level shapes, the second mask level shapes, and the cut mask level shapes define a first block mask pattern, a second block mask pattern, and a cut mask pattern that can be collectively employed to generate lithographic mask sets for printing the design shapes on a substrate.

According to an aspect of the present disclosure, a method for decomposing design shapes in a design level into a plurality of target design levels is provided. The method begins by first providing design shapes for a design level. The design shapes include first-type edges and second-type edges having different directions. Inner vertices of the design shapes are identified. A subset of the inner vertices having common coordinate values is paired. A determination is made as to whether any unmatched inner vertex is present. If such an unmatched inner vertex is present, a virtual vertex is assigned for each unmatched inner vertex. Each outer vertex is identified as a first-type vertex or a second-type vertex based on the presence or absence of a shared edge with the inner vertices and the at least one assigned virtual vertex, and based on whether the shared edge is a first-type edge or a second-type edge. First mask level shapes are generated for a first mask level. The first mask level shapes touch the first-type vertices. Second mask level shapes are generated for a second mask level. The second mask level shapes touch the second-type vertices. Cut mask level shapes are generated. The cut mask level shapes touch each first-type edges that are not over the second mask level shapes and touch each second-type edges that are not over the first mask level shapes. At least one step among the second, third, fourth, fifth, sixth, seventh, and eighth steps is performed employing an apparatus including one or more processors in communication with a memory and configured to perform the at least one step.

According to another aspect of the present disclosure, a method of manufacturing a set of three lithographic masks from a design level is provided. Design shapes for a design level can be decomposed into first mask level shapes for a first mask level, second mask level shapes for a second mask level, and cut mask level shapes as described above. A first lithographic mask including the first mask level shapes, a second lithographic mask including the second mask level shapes, and a third lithographic mask including the cut mask level shapes can be respectively manufactured.

According to yet another aspect of the present disclosure, a method of forming a pattern on a substrate is provided. Design shapes for a design level are decomposed into first mask level shapes for a first mask level, second mask level shapes for a second mask level, and cut mask level shapes as described above. A first lithographically patterned layer protecting combined areas of the first mask level shapes and the second mask level shapes is formed over a substrate. A second lithographically patterned layer physically exposing areas of the cut mask level shapes is formed over the substrate.

According to still another aspect of the present disclosure, an apparatus for decomposing design shapes in a design level into a plurality of target design levels is provided. The apparatus includes one or more processors in communication with a memory and configured to run an automated program. The automated program includes steps of identifying inner vertices of design shapes for a design level, the design shapes including first-type edges and second-type edges having different directions; pairing a subset of the inner vertices having common coordinate values; determining if any unmatched inner vertex is present, and if present, assigning a virtual vertex for each unmatched inner vertex; identifying each outer vertex as a first-type vertex or a second-type vertex based on the presence or absence of a shared edge with the inner vertices and the at least one assigned virtual vertex, and based on whether the shared edge is a first-type edge or a second-type edge; generating first mask level shapes for a first mask level, wherein the first mask level shapes touch the first-type vertices; generating second mask level shapes for a second mask level, wherein the second mask level shapes tough the second-type vertices; and generating cut mask level shapes, wherein the cut mask level shapes touch each first-type edges that are not over the second mask level shapes and touch each second-type edges that are not over the first mask level shapes.

BRIEF DESCRIPTION OF SEVERAL VIEWS OF THE DRAWINGS

FIG. 1 is a plan view of an exemplary design layout including fin shapes in a semiconductor fin level, a first design shape and a second design shape in a fin-mask design level, and gate structure shapes in a gate level according to an embodiment of the present disclosure.

FIG. 2A and FIG. 2B are a first part and a second part, respectively, of a flow chart that show processing steps for a design level decomposition method according to an embodiment of the present disclosure.

FIG. 3 illustrates an exemplary set of design shapes in a design level after identification of inner vertices according to an embodiment of the present disclosure.

FIG. 4 illustrates the exemplary set of design shapes after pairing inner vertices according to an embodiment of the present disclosure.

FIG. 5 illustrates the exemplary set of design shapes after pairing an unmatched inner vertex with a virtual vertex according to an embodiment of the present disclosure.

FIG. 6 illustrates the exemplary set of design shapes after identifying outer vertex sharing a second-type edge (C-edge) as a first-type (P-type) vertex according to an embodiment of the present disclosure.

FIG. 7 illustrates the exemplary set of design shapes after identifying outer vertex sharing a first-type edge (P-edge) as a second-type (C-type) vertex according to an embodiment of the present disclosure.

FIG. 8 illustrates the exemplary set of design shapes after identifying outer vertex sharing a first-type edge (P-edge) with a first-type vertex (P-vertex) as a first-type vertex (P-vertex) according to an embodiment of the present disclosure.

FIG. 9 illustrates the exemplary set of design shapes after identifying outer vertex sharing a second-type edge (C-edge) with a second-type vertex (C-vertex) as a second-type vertex (C-vertex) according to an embodiment of the present disclosure.

FIG. 10 illustrates the exemplary set of design shapes after identifying remaining outer vertices as first-type vertices (P-vertices) according to an embodiment of the present disclosure.

FIG. 13 illustrates the exemplary set of design shapes after extending outward edges of first mask level shapes that coincide with a portion of an edge of a second mask level shape according to an embodiment of the present disclosure.

FIG. 14 illustrates the exemplary set of design shapes after extending outward edges of second mask level shapes that coincide with a portion of an edge of a first mask level shape according to an embodiment of the present disclosure.

FIG. 15 illustrates the exemplary set of design shapes after generating cut mask level shapes so that edges of the cut mask level shapes touch first-type edges (P-edges) within the first decomposed design level (FH1 level) that are not over the second mask level shapes according to an embodiment of the present disclosure.

FIG. 16 illustrates the exemplary set of design shapes after modifying the cut mask level shapes so that edges of the cut mask level shapes touch edges connecting a first-type vertex (P-vertex) and a virtual vertex according to an embodiment of the present disclosure.

FIG. 17 illustrates the exemplary set of design shapes after generating additional cut mask level shapes so that edges of the cut mask level shapes touch second-type edges (C-edges) within the second decomposed design level (FH2 level) that are not over the first mask level shapes according to an embodiment of the present disclosure.

FIG. 18 illustrates the exemplary set of design shapes after extending outward first-type edges (P-edges) on the first mask level shapes that touch a cut mask level shape according to an embodiment of the present disclosure.

FIG. 20 illustrates a decomposition process for a first exemplary shape according to an embodiment of the present disclosure.

FIG. 21 illustrates a decomposition process for a second exemplary shape according to an embodiment of the present disclosure.

DETAILED DESCRIPTION

Figure 2B:
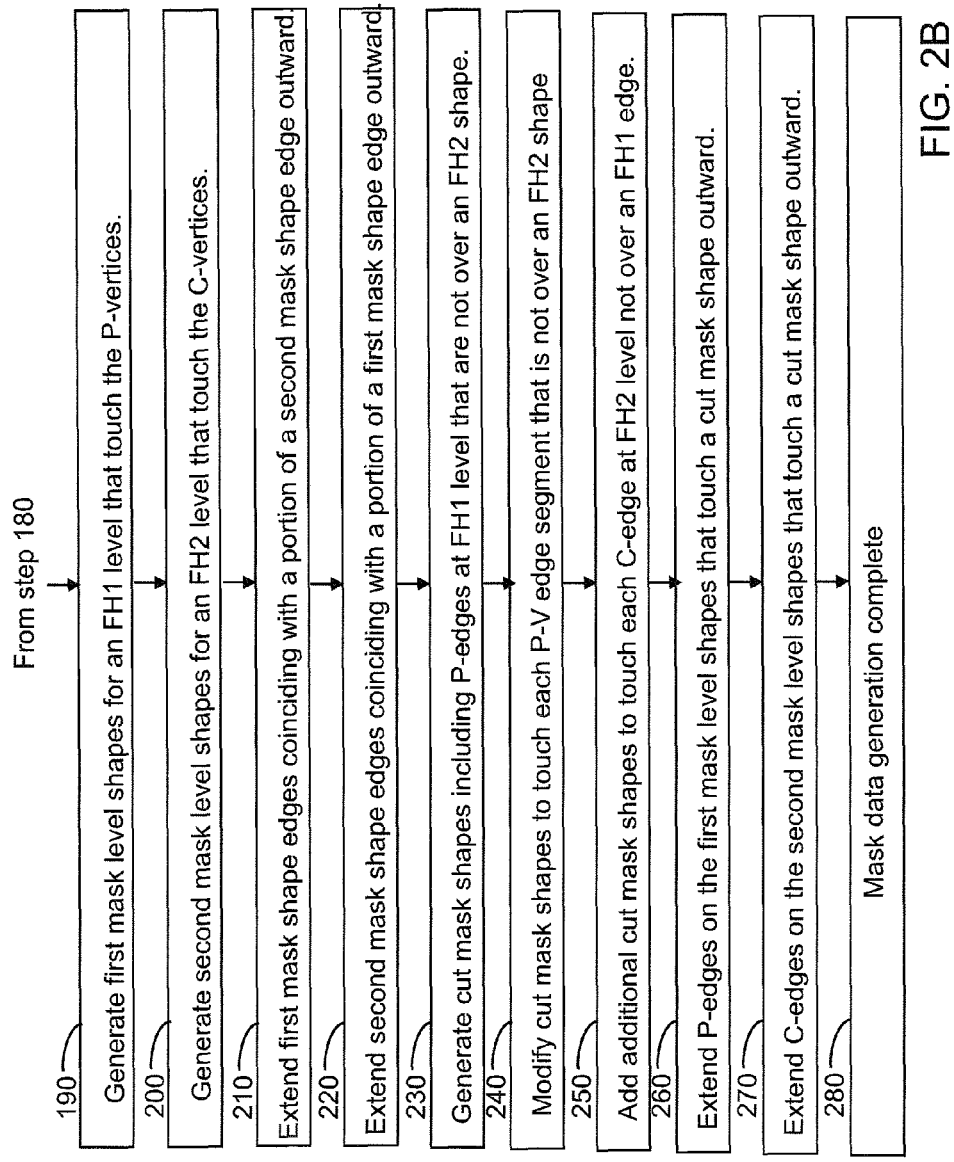

As stated above, the present disclosure relates to a method of decomposing shapes in a lithographic level into multiple sets of shapes corresponding to multiple lithographic masks, and an apparatus for implementing the same. Aspects of the present disclosure are now described in detail with accompanying figures. It is noted that like and corresponding elements are referred to by like reference numerals. The drawings are not drawn to scale. Ordinals are employed merely to distinguish different steps or elements, and different ordinals may be employed across the specification and the claims.

As used herein, "mask decomposition" refers to a method of generating a set of designs for a plurality of lithographic masks for the purpose of forming lithographic patterns within a single lithographic level. In an illustrative example, semiconductor fins may be manufactured by forming a one-dimensional array of semiconductor fins and subsequently cutting the semiconductor fins to remove unwanted portions employing a set of lithographic masks. The lithographic level that defines the areas of the semiconductor fins to be removed can be decomposed into multiple levels by mask decomposition.

Referring to FIG. 1, a plan view of an exemplary design layout illustrates multiple design levels employed for manufacture of semiconductor devices. The exemplary design layout includes fin shapes 10 in a semiconductor fin level, a first design shape 20A and a second design shape 20B in a fin-mask design level, and gate structure shapes 30 in a gate level. The fin-mask design level is also referred to as an "RX level." The area of the fin shapes in the design layout corresponds to the physical area on a semiconductor substrate in which initial semiconductor fins are to be formed as a one-dimensional periodic array. The area of the first design shape 20A and the second design shape 20B in the design layout corresponds to the physical area on the semiconductor substrate to be covered with a patterned masking material layer. The patterned masking material layer protects underlying portions of the initial semiconductor fins during an etch process that etches physically exposed portions of the initial semiconductor fins that are not covered by the patterned masking material layer. The remaining portions of the initial semiconductor fins that are cut to target lengths are referred to truncated semiconductor fins, which are employed to form semiconductor devices such as field effect transistors therein.

Gate electrodes are formed over various portions of the truncated semiconductor fins in physical areas corresponding to the areas of the gate structure shapes 30 in the design layout. Attempts to form a patterned masking material layer with a single lithographic exposure of a mask that includes all design shapes of the fin-mask design level can result in formation of spurious and often deleterious components or elimination of necessary components during manufacture of semiconductor devices. Distortion of the lithographic image reflecting the design shapes in the fin-mask design level can be minimized by a pattern decomposition method of the present disclosure.

Referring to FIG. 2A and FIG. 2B, a flow chart shows processing steps for a design level decomposition method according to an embodiment of the present disclosure. The design level decomposition method of FIGS. 2A and 2B can be employed to decompose a set of design level shapes for a block level. As used herein, a block level refers to a level that defines an area in which an effect of processing (such as an etch) is prevented, i.e., "blocked." As applied to the exemplary design layout of FIG. 1, the block level can be the fin-mask design level including design shapes that define portions of semiconductor fins that are to be blocked from, i.e., prevented from, removal. The complementary portions of the semiconductor fins located in regions that correspond to areas outside of the design shapes are removed during an etch that removes physically exposed portions of the semiconductor fins.

The method of FIGS. 2A and 2B can be employed to decompose design shapes in a design level into a plurality of target design levels. Specifically, the method of FIGS. 2A and 2B can be employed to decompose design shapes in a design level into first mask level shapes in a first mask level, second mask level shapes in a second mask level, and cut mask level shapes in a cut mask level. The entire set of the area of the decomposed design shapes is the same as the difference between a union set and the entire set of the cut mask level shapes in the cut mask level, i.e., a difference between the union set and the entire set of the cut mask level shapes in the cut mask. The union set is the set of the union of the entire set of first mask level shapes and the entire set of second mask level shapes.

Any step in the flow chart of FIGS. 2A and 2B can be performed employing an apparatus including one or more processors in communication with a memory and configured to perform the step. The apparatus can include a computer as known in the art, provided that the computer is pre-programmed with an automated program for running any of the steps in the flow chart of FIGS. 2A and 2B, or is loaded with an automated program, which can be stored in any machine-readable data storage medium known in the art and read into the computer through a data reader such as a CD-ROM drive or through local area network or through internet connection.

Referring to step 100, a design level decomposition process is initiated by providing design shapes for a design level. The design shapes including first-type edges and second-type edges having different directions. As used herein, an "edge" is a straight line connecting two points in a design layout. The first-type edges and the second-type edges are distinguished by the direction of the edges. Thus, the direction of the first-type edges is different from the direction of the second-type edges. In one embodiment, the first-type edges are perpendicular to the second-type edges. In another embodiment, the direction of the first-type edges and the direction of the second-type edges can be selected not to be perpendicular to each other. In some embodiments, the design shapes can consist of the first-type edges and the second-type edges.

In one embodiment, the first-type edges are parallel to the lengthwise direction of a one-dimensional array of features to be formed on a semiconductor substrate (such as initial semiconductor fins represented by the fin shapes in FIG. 1), and are referred to as "parallel edges" or "P-edges." The second-type edges are parallel to the direction of cuts through the one-dimensional array of features to be formed on the semiconductor substrate, and are referred to as "cut edges" or "C-edges."

Referring to step 110, inner vertices are identified. Step 110 is illustrated employing an exemplary set of design shapes in a design level as shown in FIG. 3. As used herein, a "vertex" is a point in a design shape at with a first-type edge adjoins a second-type edge. As used herein, an "inner vertex" is a vertex of a design shape at which the angle between the two adjoining edges is greater than 180 degrees if measured along an infinitesimally small arc that includes an area enclosed by the design shape that contains the vertex. As used herein, an "outer vertex" is a vertex of a design shape at which the angle between the two adjoining edges is less than 180 degrees if measured along an infinitesimally small arc that includes an area enclosed by the design shape that contains the vertex. Each inner vertex is labeled "i" in FIG. 3.

Referring to step 120 of FIG. 2A, inner vertices are paired employing coordinates of the inner vertices. Step 120 is illustrated employing the exemplary set of design shapes in the design level as shown in FIG. 4. A subset of the inner vertices is paired in this step. The subset of vertices may be the same as the entire set of inner vertices, or may be less than the entire set of inner vertices.

For example, the coordinate values of the inner vertices may be evaluated in a Cartesian coordinate system or in a non-Cartesian coordinate system. If a Cartesian coordinate system is employed, two coordinate values (such as an x-coordinate value and a y-coordinate value) may be employed to identify each inner vertex. The subset of the inner vertices includes at least one pair of inner vertices having common coordinate values in a Cartesian coordinate system or a non-Cartesian coordinate system. The common coordinate value may be an x-coordinate value or a y-coordinate value. Thus, each line connecting a pair of inner vertices that are paired in this step is parallel to the x-axis or parallel to the y-axis. The pairing of inner vertices is performed under the constraint that the line connecting the pair of inner vertices divides the design shape that includes both of the inner vertices. In one embodiment, the pairing of the subset of the inner vertices are performed by pairing each first pair, if any, of inner vertices having a common Cartesian coordinate for a direction along which the second-type edges extend provided that a line connecting the first pair divides the design shape including the first pair, and pairing each second pair, if any, of inner vertices having a common Cartesian coordinate for a direction along which the first-type edges extend provided that a line connecting the second pair divides the design shape including the second pair. Each pair of paired inner vertices is represented by a dotted line connecting the paired inner vertices.

Referring to step 130 of FIG. 2A, each unmatched inner vertex is paired with a virtual vertex. Step 130 is illustrated employing the exemplary set of design shapes in the design level as shown in FIG. 5. At this step, whether any unmatched inner vertex is present is determined. If any such unmatched inner vertex (i.e., an inner vertex that is not paired at step 120) is present, a virtual vertex is assigned for each unmatched inner vertex. As used herein, a "virtual vertex" is a point on an edge that is not an end point of the edge and shares a same coordinate value with an unmatched inner vertex such that a line connecting the unmatched inner vertex and the virtual vertex is parallel to the direction of the first-type edges or to the direction of the second-type edges and divides the design shape that includes the unmatched inner vertex and the design shape. In one embodiment, for each unmatched inner vertex, a virtual vertex can be assigned by determining a point having a common Cartesian coordinate for a direction along which the first-type edges extend and located on a first-type edge of a design shape including the unmatched inner vertex provided that a line connecting the virtual vertex and the unmatched inner vertex divides the design shape. The virtual vertex can be selected not to share an edge with any inner vertex. A virtual vertex is labeled "v" in FIG. 5.

In subsequent steps 140, 150, 160, and 170, each outer vertex is identified as a first-type vertex or a second-type vertex based on the presence or absence of a shared edge with the inner vertices and any assigned virtual vertex, and based on whether the shared edge is a first-type edge or a second-type edge. The order of step 140 and step 150 may be optionally reversed. The order of step 160 and step 170 may be optionally reversed.

Referring to step 140 of FIG. 2A, each outer vertex sharing a second-type edge with an inner vertex is identified as a first-type vertex. Step 140 is illustrated employing the exemplary set of design shapes in the design level as shown in FIG. 6. If the second-type edge is a C-edge, the first-type edge can be a parallel-type vertex, or a "P-type" vertex. A "parallel-type" vertex or a "P-type" vertex herein refers to a vertex that is more closely associated with a parallel edge than with a cut edge for the purpose of classifying outer vertices. Thus, each outer vertex sharing a second-type edge (e.g., a C-edge) with any inner vertex is identified as a first-type vertex (e.g., a P-vertex), and is labeled as such.

Referring to step 150 of FIG. 2A, each outer vertex sharing a first-type edge is identified as a second-type vertex. Step 150 is illustrated employing the exemplary set of design shapes in the design level as shown in FIG. 7. If the first-type edge is a P-edge, the second-type edge can be a cut-type vertex, or a "C-type" vertex. A "cut-type" vertex or a "C-type" vertex herein refers to a vertex that is more closely associated with a cut edge than with a parallel edge for the purpose of classifying outer vertices. Thus, each outer vertex sharing a first-type edge (e.g., a P-edge) with any inner vertex is identified as a second-type vertex (e.g., a C-vertex), and is labeled as such.

Referring to step 160 of FIG. 2A, each outer vertex sharing a first-type edge with a first-type vertex is identified as an additional first-type vertex. Step 160 is illustrated employing the exemplary set of design shapes in the design level as shown in FIG. 8. For example, each outer vertex sharing a P-type edge with a P-vertex is identified as an additional P-vertex, and is labeled as such.

Referring to step 170 of FIG. 2A, each outer vertex sharing a second-type edge with a second-type vertex is identified as an additional second-type vertex. Step 170 is illustrated employing the exemplary set of design shapes in the design level as shown in FIG. 9. For example, each outer vertex sharing a C-type edge with a C-vertex is identified as an additional C-vertex, and is labeled as such.

Referring to step 180 of FIG. 2A, remaining outer vertices as first-type vertices. Step 180 is illustrated employing the exemplary set of design shapes in the design level as shown in FIG. 10. Any outer vertex not identified as a first-type vertex or a second-type vertex during the steps 140, 150, 160, and 170 are identified as an additional first-type vertex. For example, if the outer vertices are classified among P-vertices and C-vertices, any outer vertex that is not identified as a P-vertex or as a C-vertex during the steps 140, 150, 160, and 170 is identified as an additional P-vertex at step 180.

Figure 11:
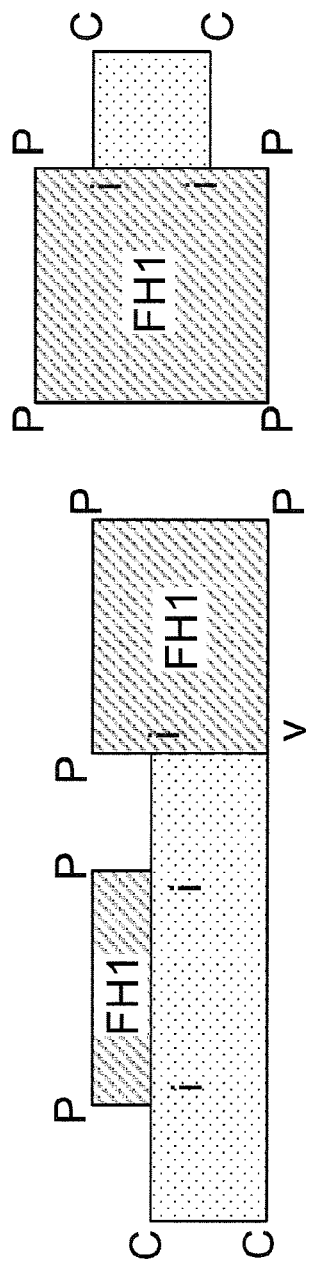
FIG. 11 illustrates the exemplary set of design shapes after generating first mask level shapes for a first decomposed design level (FH1 level) so that the first mask level shapes touch all first-type vertices (P-vertices) according to an embodiment of the present disclosure.

Referring to step 190 of FIG. 2B, first mask level shapes for a first decomposed design level are generated. Step 190 is illustrated employing the exemplary set of design shapes in the design level as shown in FIG. 11. The first mask level shapes for the first decomposed design level are generated so that the first mask level shapes touch all first-type vertices (P-vertices). Each first mask level shape touches at least one of the first-type vertices, and each of the first-type vertices is a vertex of a first mask level shape. The size of each first mask level shape is selected such that each first mask level shape does not cross over any line connecting a paired set of inner vertices or any line connecting an inner vertex paired with a virtual vertex. In other words, each line connecting a paired set of inner vertices and each line connecting an inner vertex paired with a virtual vertex is treated as additional cuts introduced into the design shapes in the provided design level. The additional cuts generate design sub-shapes that are bounded by the first-type edges, the second-type edges, the lines connecting each paired set of inner vertices, and the lines connecting each virtual vertex with the corresponding virtual vertex. The entire set of design sub-shapes including any first-type vertex constitutes the first mask level shapes. In FIG. 11, the first mask level shapes are labeled as "FH1" shapes, and the first mask level is herein referred to as an "FH1" level.

Figure 12:
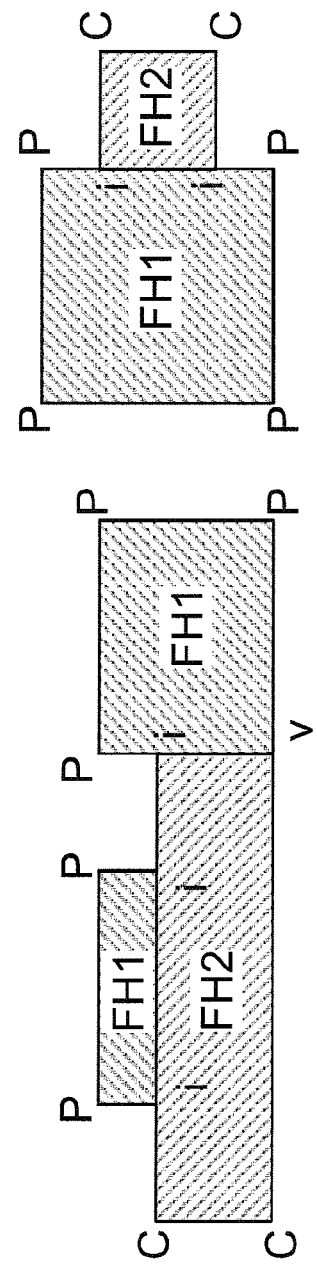
FIG. 12 illustrates the exemplary set of design shapes after generating second mask level shapes for a second decomposed design level (FH2 level) so that the second mask level shapes touch all second-type vertices (C-vertices) according to an embodiment of the present disclosure.

Referring to step 200 of FIG. 2B, second mask level shapes for a second decomposed design level are generated. Step 200 is illustrated employing the exemplary set of design shapes in the design level as shown in FIG. 12. In one embodiment, the second mask level shapes for the second decomposed design level are generated so that the second mask level shapes touch all second-type vertices (C-vertices). Each second mask level shape touches at least one of the second-type vertices, and each of the second-type vertices is a vertex of a second mask level shape. The size of each second mask level shape is selected such that each second mask level shape does not cross over any line connecting a paired set of inner vertices or any line connecting an inner vertex paired with a virtual vertex. As in step 190, each line connecting a paired set of inner vertices and each line connecting an inner vertex paired with a virtual vertex is treated as additional cuts introduced into the design shapes in the provided design level. The entire set of design sub-shapes including any second-type vertex constitutes the second mask level shapes. In FIG. 12, the second mask level shapes are labeled as "FH2" shapes, and the second mask level is herein referred to as an "FH2" level.

In steps 210 and 220 of FIG. 2B, at least one edge of the first mask level shapes and the second mask level shapes can be extended outward to as to provide an areal overlap thereamongst. The order of step 210 and step 220 may be optionally reversed.

Referring to step 210 of FIG. 2B, edges of the first mask level shapes that coincide with a portion of any edge of the second mask level shapes are extended outward, i.e., along a direction that increases the area of the corresponding first mask level shape. Step 210 is illustrated employing the exemplary set of design shapes in the design level as shown in FIG.

13. For example, the edges of the first mask level shapes (e.g., FH1 shapes) that coincide with a portion of any edge of the second mask level shapes (e.g., FH2 shapes) are extended outward by a first offset distance x. In one embodiment, the first offset distance x can be less than one half of the least distance among second-type edges in the set of design shapes as provided. Additionally or alternately, the first offset distance x can be greater than a maximum lithographic distance by which a pattern can shift or by which a pattern can be altered due to optical proximity effects. In one embodiment, the first offset distance x can be in a range from 2.5 nm to 50 nm, although lesser and greater first offset distances can also be employed.

Referring to step 220 of FIG. 2B, edges of the second mask level shapes that coincide with a portion of any edge of the first mask level shapes are extended outward, i.e., along a direction that increases the area of the corresponding second mask level shape. Step 220 is illustrated employing the exemplary set of design shapes in the design level as shown in FIG. 14. For example, the edges of the second mask level shapes (e.g., FH2 shapes) that coincide with a portion of any edge of the first mask level shapes (e.g., FH1 shapes) are extended outward by a second offset distance y. In one embodiment, the second offset distance y can be less than one half of the least distance among first-type edges in the set of design shapes as provided. Additionally or alternately, the second offset distance y can be greater than a maximum lithographic distance by which a pattern can shift or by which a pattern can be altered due to optical proximity effects. In one embodiment, the second offset distance y can be in a range from 2.5 nm to 50 nm, although lesser and greater second offset distances can also be employed.

In steps 230, 240, and 250, cut mask level shapes are generated such that the cut mask level shapes touch each first-type edges that are not over the second mask level shapes and touch each second-type edges that are not over the first mask level shapes. Optionally, step 250 may be performed prior to steps 230 and 240.

Referring to step 230 of FIG. 2B, cut mask level shapes for a cut mask level are generated so that edges of the cut mask level shapes touch first-type edges within the first decomposed design level that are not over the second mask level shapes. Step 230 is illustrated employing the exemplary set of design shapes in the design level as shown in FIG. 15. As used herein, an edge is "over" a shape if the edge coincides with any portion of an edge of the shape or within the area of the shape. For example, the cut mask level shapes can be generated so that edges of the cut mask level shapes touch the P-edges of the FH1 shapes (which are within the FH1 level) that are not over the FH2 shapes (which are within the FH2 level). Thus, the cut mask level shapes in FIG. 15 are labeled as "FH_cut" shapes. The FH_cut shapes touch an upper P-edge of the leftmost FH1 shape, an upper P-edge of the middle FH1 shape, an upper P-edge of the rightmost FH1 shape, and a lower P-edge of the rightmost FH1 shape. A lower P-edge of the leftmost FH1 shape is "over" a FH2 shape because the lower P-edge of the leftmost FH1 shapes is within the area of an FH2 shape. A lower P-edge of the middle FH1 shape is "over" a FH2 shape because the lower P-edge of the middle FH1 shape (i.e., the line that connects the virtual vertex v and the P-vertex immediately to the right) overlies a portion of an edge of the left side FH2 shape caused by the lateral extension performed at step 220. The dimension of each cut mask level shape in a direction along the second-type edges (e.g., along the direction of the C-edges) can be preset, or can be determined based on a distance to the coordinates of the first mask level shapes or the second mask level shapes to ensure that the cut mask level shape does not overlap any firs mask level shape or the second mask level shape at this step.

Referring to step 240 of FIG. 2B, the cut mask level shapes for the cut mask level are modified, either by extending a preexisting cut mask level shape or by adding a new cut mask level shape, so that edges of the cut mask level shapes touch each edge connecting a first-type vertex and a virtual vertex. Step 240 is illustrated employing the exemplary set of design shapes in the design level as shown in FIG. 16. Specifically, for each virtual index, a new cut mask level shape may be added or an existing cut mask level shape may be modified so that a portion of an edge of a cut mask level shape contacts an edge connecting the virtual index and a first-type vertex. For example, the FH_cut shape touching the lower P-edge of the rightmost FH1 shape may be extended to touch the edge connecting the virtual vertex v and the bottom right P-vertex of the middle FH1 shape.

Referring to step 250 of FIG. 2B, additional cut mask level shapes are generated so that edges of the additional cut mask level shapes touch second-type edges within the second decomposed design level that are not over the first mask level shapes. Step 250 is illustrated employing the exemplary set of design shapes in the design level as shown in FIG. 17. For example, edges of the additional cut mask level shapes touch C-edges of the FH2 shapes within the FH2 level that are not over an FH1 shape. The dimension of each added cut mask level shape in a direction along the first-type edges (e.g., along the direction of the P-edges) can be preset, or can be determined based on a distance to the coordinates of the first mask level shapes or the second mask level shapes to ensure that the added cut mask level shape does not overlap any firs mask level shape or the second mask level shape at this step.

In steps 260 and 270 of FIG. 2B, at least one edge of the first mask level shapes and the second mask level shapes can be extended outward to as to provide an areal overlap with cut mask level shapes. The order of step 260 and step 270 may be optionally reversed.

Referring to step 260 of FIG. 2B, edges of the first mask level shapes that touch a cut mask level shape are extended outward, i.e., along a direction that increases the area of the corresponding first mask level shape. Step 260 is illustrated employing the exemplary set of design shapes in the design level as shown in FIG. 18. For example, the edges of the first mask level shapes (e.g., FH1 shapes) that coincide with a portion of any edge of the cut mask level shapes (e.g., FH_cut shapes) are extended outward by a third offset distance z. In one embodiment, the third offset distance z can be less than one half of the dimension of the cut mask level shape along the direction of the second-type edge. Additionally or alternately, the third offset distance z can be greater than a maximum lithographic distance by which a pattern can shift or by which a pattern can be altered due to optical proximity effects. In one embodiment, the third offset distance z can be in a range from 2.5 nm to 50 nm, although lesser and greater third offset distances can also be employed.

Figure 19:
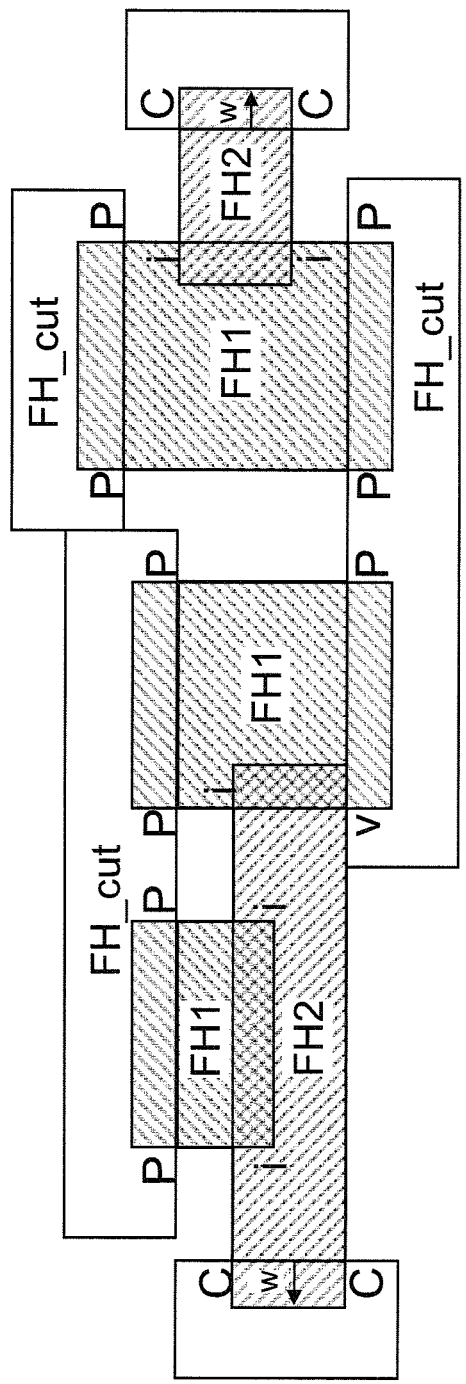
FIG. 19 illustrates the exemplary set of design shapes after extending outward second-type edges (C-edges) on the second mask level shapes that touch a cut mask level shape according to an embodiment of the present disclosure.

Referring to step 270 of FIG. 2B, edges of the second mask level shapes that touch a cut mask level shape are extended outward, i.e., along a direction that increases the area of the corresponding second mask level shape. Step 270 is illustrated employing the exemplary set of design shapes in the design level as shown in FIG. 19. For example, the edges of the second mask level shapes (e.g., FH2 shapes) that coincide with a portion of any edge of the cut mask level shapes (e.g., FH_cut shapes) are extended outward by a fourth offset distance w. In one embodiment, the fourth offset distance w can be less than one half of the dimension of the cut mask level shape along the direction of the first-type edge. Additionally or alternately, the fourth offset distance w can be greater than a maximum lithographic distance by which a pattern can shift or by which a pattern can be altered due to optical proximity effects. In one embodiment, the fourth offset distance w can be in a range from 2.5 nm to 50 nm, although lesser and greater fourth offset distances can also be employed.

Thus, a set of three design levels to be implemented in three separate lithographic masks can be generated from a design level by the mask decomposition process described above. In one embodiment, a set of three lithographic masks can be manufactured employing the three design levels derived from a design level through the mask decomposition described above. In this case, design shapes for a design level are decomposed into first mask level shapes for a first mask level, second mask level shapes for a second mask level, and cut mask level shapes employing the method of flow chart in FIGS. 2A and 2B. A first lithographic mask including the first mask level shapes can be manufactured. A second lithographic mask including the second mask level shapes can be manufactured. A third lithographic mask including the cut mask level shapes can be manufactured.

In one embodiment, a pattern that replicates the design shapes in a design level can be formed on a substrate employing the mask decomposition method described above. First, design shapes for a design level are decomposed into first mask level shapes for a first mask level, second mask level shapes for a second mask level, and cut mask level shapes employing the method of the flow chart in FIGS. 2A and 2B.

For example, a first lithographically patterned layer protecting combined areas of the first mask level shapes and the second mask level shapes is formed over a substrate. The first lithographically patterned layer can be formed, for example, by applying a negative photoresist layer and consecutively lithographically exposing areas corresponding to the first mask level shapes for the first mask level and second mask level shapes for the second mask level. Alternately, the first lithographically patterned layer can be formed, for example, by applying a positive photoresist layer and consecutively lithographically exposing areas corresponding to the complement of the first mask level shapes for the first mask level and the complement of the second mask level shapes for the second mask level. Structures in areas that are not covered by the first lithographically patterned layer can be etched, for example, by a wet etch or a dry etch. Subsequently, a second lithographically patterned layer physically exposing areas of the cut mask level shapes is formed over the substrate. The second lithographically patterned layer can be formed, for example, by applying a positive photoresist layer and lithographically exposing areas corresponding to the cut mask level shapes for the cut mask level. Alternately, the second lithographically patterned layer can be formed, for example, by applying a negative photoresist layer and lithographically exposing areas corresponding to the complement of the cut mask level shapes for the cut mask level.

Referring to FIGS. 20 and 21, decomposition processes for a first exemplary shape and a second exemplary shape are illustrated, respectively. The decomposition process results in generation of at least one first mask level shape (FH1 shape) and at least one second mask level shape (FH2 shape) and at least one cut mask level shape (FH_cut shape).

Figure 22:
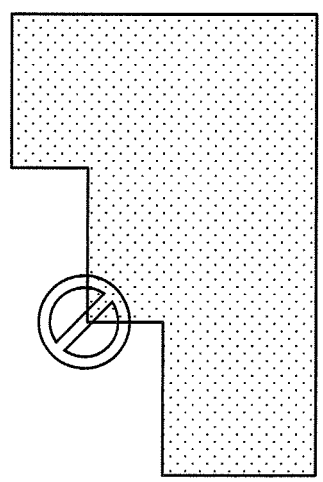
FIG. 22 illustrates application of a first exemplary design rule that may be employed in conjunction with the decomposition methods of the present disclosure.

Optionally, groundrules may be employed to ensure that the decomposition process described in the flow chart of FIGS. 2A and 2B does not generate an anomalous result. For example, one of the groundrules may impose the condition that prohibits a perimeter path between inner vertices touching exactly 1 outer vertex. The prohibited condition is illustrated in FIG. 22, which shows an outer vertex that adjoins two edges that form a perimeter path between two inner vertices and includes exactly 1 outer vertex (at which the prohibition symbol of a circle with a slash within is placed).

Figure 23:
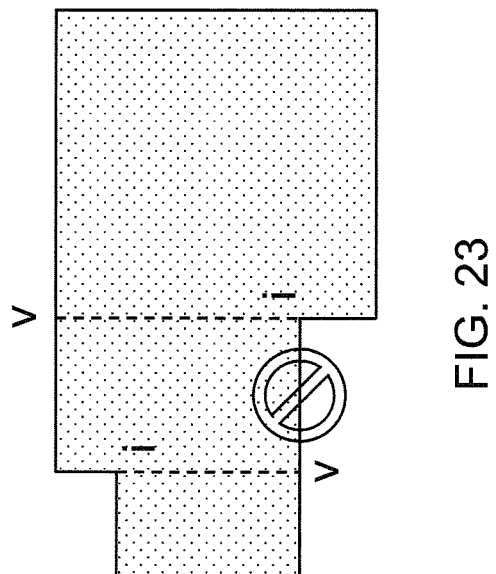
FIG. 23 illustrates application of a second exemplary design rule that may be employed in conjunction with the decomposition methods of the present disclosure.

In another example, one of the groundrules may impose the condition that prohibits formation of a virtual vertex on an edge that touched an inner vertex, i.e., on an edge having an inner vertex at one end. The prohibited condition is illustrated in FIG. 23, which shows an attempted formation of a virtual vertex on an edge having an inner vertex at the right-side end. A prohibition symbol is placed on the edge having an inner vertex at the right-side end.

Additional restrictions in the form of groundrules may be imposed for the design shapes allowed in a design level provided at step 100 of FIG. 2A. Another exemplary groundrule can require that a Line connecting matching pairs of inner vertices must divide a design shape into two parts.

Figure 24:
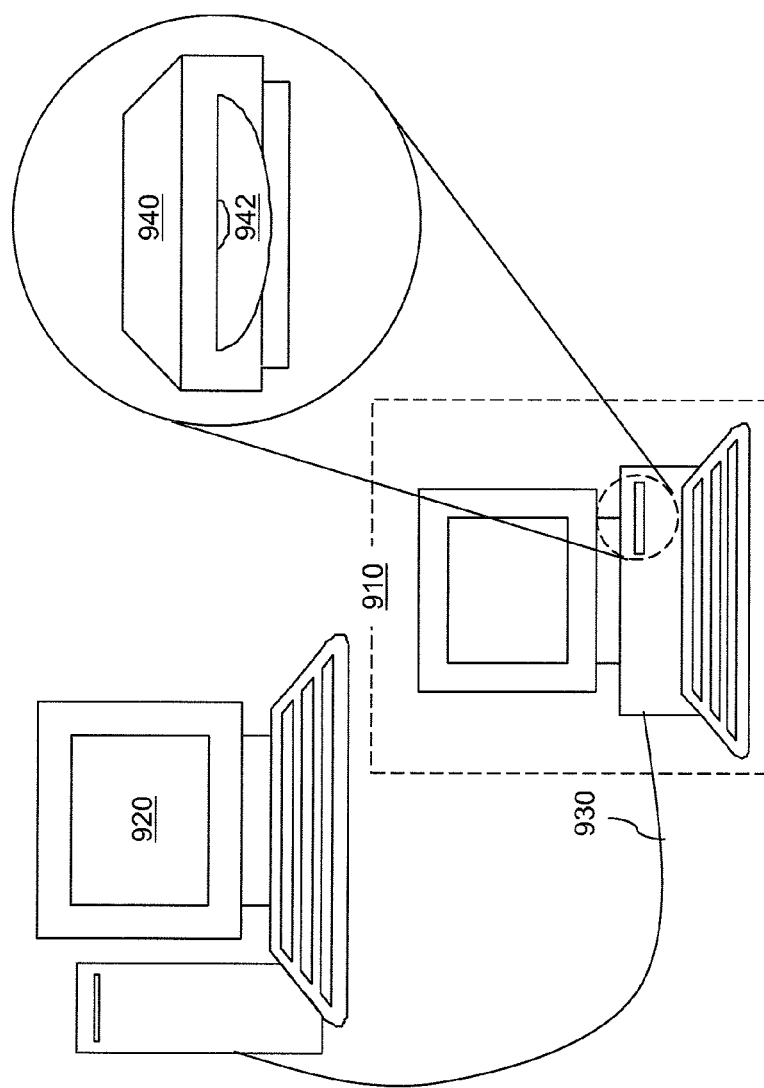
FIG. 24 illustrates an exemplary apparatus that can be employed to implement the methods of various embodiments of the present disclosure.

Referring to FIG. 24, an exemplary apparatus is illustrated, which can be employed to implement the methods of various embodiments of the present disclosure. The apparatus can be configured to perform at least one and/or any of the steps in the flow chart in FIGS. 2A and 2B in an automated step by running an automated program on any computing means known in the art. The apparatus can be employed to decompose design shapes in a design level into a plurality of target design levels. The apparatus including one or more processors in communication with a memory and configured to run an automated program.

The automated program can include a step of identifying inner vertices of design shapes for a design level. The design shapes including first-type edges and second-type edges having different directions as described above. The automated program can include a step of pairing a subset of the inner vertices having common coordinate values. The automated program can further include a step of determining if any unmatched inner vertex is present, and if present, assigning a virtual vertex for each unmatched inner vertex. The automated program can further include a step of identifying each outer vertex as a first-type vertex or a second-type vertex based on presence or absence of a shared edge with the inner vertices and the at least one assigned virtual vertex, and based on whether the shared edge is a first-type edge or a second-type edge. The automated program can further include a step of generating first mask level shapes for a first mask level, wherein the first mask level shapes touch the first-type vertices. The automated program can further include a step of generating second mask level shapes for a second mask level, wherein the second mask level shapes tough the second-type vertices. The automated program can further include a step of generating cut mask level shapes, wherein the cut mask level shapes touch each first-type edges that are not over the second mask level shapes and touch each second-type edges that are not over the first mask level shapes.

In one embodiment, the apparatus can include at least one computing means 910 including one or more processor units that are in communication with a memory. The at least one computing means 910 can include a computer as known in the art. The at least one computing means 910 can be in communication with a database 920, which can be a standalone computing means or can be incorporated into the at least one computing means 910. The database can store all or a subset of the design shapes for the design level provided at step 100 of FIG. 2A. If the database 920 is a standalone computing means, a data cable 930 or wireless communication can be employed to transfer data between the database 920 and the at least one computing means 910. The database can store information on reticle shapes, illuminator shapes, and various parameters of a lithographic illumination system.

The at least one computing means 910 can be employed to perform at least one or all of the steps described above with, or without, human intervention depending on the program that runs thereupon. The input data and the output data (e.g., the design for a pupil filter according to various embodiments of the present disclosure) can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps in FIG. 1.

The design data including the various design shapes for the design level as originally provided, for the first mask level shapes of the first mask level, for the second mask level shapes for the second mask level, and for the cut mask level shapes for the cut mask level may be modified employing the various embodiments of the present disclosure. The final version of the decomposed design including the first mask level shapes of the first mask level, the second mask level shapes for the second mask level, and the cut mask level shapes for the cut mask level can be transferred to a manufacturing facility that can manufacture a set of three lithographic masks corresponding to the three distinct data set including design shapes for the three decomposed design levels. The data transfer to the mask writing device can be effected by a portable non-transitory machine-readable data storage medium 942, a data cable (not shown) or by wireless communication.

In one embodiment, the various data employed in the method of the present disclosure, including the design layout, the annotated design layout, any intermediate structure files, and the final structure file, can be in any data format used for the exchange of layout data of integrated circuits and/or symbolic data format (e.g. information stored in a GDSII (GDS2), GL1, OASIS, map files, or any other suitable format for storing such design data structures). The various data may comprise information such as, for example, symbolic data, map files, test data files, design content files, layout parameters, and any other data required by a reticle manufacturer to manufacture a set of at least one reticle encoding the third modified chip design layout.

A machine-readable medium embodying the design data for the three decomposed design levels of the present disclosure can have the functionality of generating a representation, in a format perceptible by humans or recognizable by an automated machine (such as an optical character reader or a program configured to recognize graphics data), of a semiconductor structure, a semiconductor device, a semiconductor circuit, or any other physical implementation of the devices and structures of the present disclosure. The design data for the three decomposed design levels of the present disclosure, as embodied in the machine-readable medium, can be organized such that the inherent physical or logical relationship among data elements can be represented in a temporary or permanent display device such as a computer monitor or at least one printed sheet of paper. Further, the design data for the three decomposed design levels of the present disclosure can be designed to support specific data manipulation functions, including, but not limited to, editing, adding, subtracting, or otherwise modifying or modulating the various data elements within the design data for the three decomposed design levels. In addition, the design data for the three decomposed design levels of the present disclosure can be configured to cause the representation in the format perceptible by humans or recognizable by an automated machine to include various display elements (e.g., line, curves, symbols, areas, volumes, etc.) that correspond to each of the various data elements within the design data for the three decomposed design levels. The design data for the three decomposed design levels of the present disclosure can be a functional descriptive material as recorded on the machine-readable medium, and as such, can become structurally and functionally interrelated to the machine-readable medium so as to change the format and organization of the various memory elements within the machine-readable medium and confer a functionality of generating at least one visual representation when read by a display program, which can be a visual display program or a printing program, and can reside in a computing device, or can be encoded within the same machine-readable medium, or can be encoded within a different machine-readable medium that can be read by the same computing device that reads the machine-readable medium encoding the design data for the three decomposed design levels of the present disclosure.

In one embodiment, a machine-readable medium embodying the design data for the three decomposed design levels of the present disclosure can additionally encode a computer program that enables the generation of a representation, in a format perceptible by humans or recognizable by an automated machine. In one embodiment, the computer program that enables the generation of a representation, in a format perceptible by humans or recognizable by an automated machine can reside in a computing device or in another machine-readable medium that can be read by a computing device configured to read the machine-readable medium embodying the design data for the three decomposed design levels of the present disclosure.

Upon running of the computer program on the design data for the three decomposed design levels of the present disclosure, a representation of the design data for the three decomposed design levels is generated in a format perceptible by humans or recognizable by an automated machine, which can be employed to design, manufacture, and/or to test any of a semiconductor structure, a semiconductor device, a semiconductor circuit, or any other physical implementation of the devices, structures and/or circuits of the present disclosure as embodied in the design data for the three decomposed design levels. Alternately or additionally, a representation of the design data for the three decomposed design levels as generated in a format perceptible by humans or recognizable by an automated machine can be employed to design, manufacture, and/or to test any design for a semiconductor structure, a semiconductor device, a semiconductor circuit, or any other physical implementation of the devices and structures of the present disclosure as embodied in the design data for the three decomposed design levels.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method comprising:
   a first step of providing design shapes for a design level, said design shapes including first-type edges and second-type edges having different directions;
   a second step of identifying inner vertices of said design shapes;
   a third step of pairing a subset of said inner vertices having common coordinate values;
   a fourth step of determining if any unmatched inner vertex is present after all inner vertices that can be paired based on common coordinate values are paired, and if present, assigning a virtual vertex for each unmatched inner vertex;
   a fifth step of identifying each outer vertex as a first-type vertex or a second-type vertex based on presence or absence of a shared edge with said inner vertices and said at least one assigned virtual vertex, and based on whether said shared edge is a first-type edge or a second-type edge;
   a sixth step of generating first mask level shapes for a first mask level, wherein said first mask level shapes touch said first-type vertices;
   a seventh step of generating second mask level shapes for a second mask level, wherein said second mask level shapes touch said second-type vertices; and
   an eighth step of generating cut mask level shapes, wherein said cut mask level shapes touch each first-type edges that are not over said second mask level shapes and touch each second-type edges that are not over said first mask level shapes,
   wherein at least one step among said second, third, fourth, fifth, sixth, seventh, and eighth steps is performed employing an apparatus comprising one or more processors in communication with a memory and configured to perform said at least one step.

2. The method of claim 1, further comprising:
   a first additional step of identifying each outer vertex sharing a second-type edge with any inner vertex as a first-type vertex; and
   a second additional step of identifying each outer vertex sharing a first-type edge with any inner vertex as a second-type vertex.

3. The method of claim 2, further comprising:
   a third additional step of identifying each outer vertex sharing a first-type edge with a first-type vertex as another first-type vertex; and
   a fourth additional step of identifying each outer vertex sharing a second-type edge with a second-type vertex as another second-type vertex.

4. The method of claim 3, further comprising a fifth additional step of identifying any outer vertex not identified as a first-type vertex or a second-type vertex during said first additional step, said second additional step, said third additional step, and said fourth additional step as an additional first-type vertex.

5. The method of claim 1, wherein said design shapes consist of said first-type edges and said second-type edges.

6. The method of claim 1, wherein said first-type edges are perpendicular to said second-type edges.

7. The method of claim 6, wherein said pairing of said subset of said inner vertices are performed by:
   pairing each first pair, if any, of inner vertices having a common Cartesian coordinate for a direction along which said second-type edges extend provided that a line connecting said first pair divides a design shape including said first pair; and
   pairing each second pair, if any, of inner vertices having a common Cartesian coordinate for a direction along which said first-type edges extend provided that a line connecting said second pair divides a design shape including said second pair.

8. The method of claim 6, wherein said virtual vertex is assigned by determining a point having a common Cartesian coordinate for a direction along which said first-type edges extend and located on a first-type edge of a design shape including said unmatched inner vertex provided that a line connecting said virtual vertex and said unmatched inner vertex divides said design shape.

9. The method of claim 8, wherein said virtual vertex is selected not to share an edge with any inner vertex.

10. The method of claim 1, further comprising extending outward at least one edge of said first mask level shapes, said second mask level shapes, and said cut mask level shapes to as to provide an areal overlap thereamongst.

11. The method of claim 1, further comprising:
    a first additional step of extending outward edges of said first mask level shapes that coincide with a portion of any edge of said second mask level shapes; and
    a second additional step of extending outward edges of said second mask level shapes that coincide with a portion of any edge of said second mask level shapes.

12. The method of claim 11, further comprising:
    a third additional step of extending outward first-type edges on said first mask level shapes that touch a portion of an edge of said cut mask level shapes; and
    a fourth additional step of extending outward second-type edges on said second mask level shapes that touch a portion of an edge of said cut mask level shapes.

13. The method of claim 1, further comprising an additional step of, for each virtual index, adding a new cut mask level shape or modifying an existing cut mask level shape so that a portion of an edge of a cut mask level shape contacts an edge connecting a first-type vertex and said virtual index.

14. The method of claim 1, further comprising:
    manufacturing a first lithographic mask including said first mask level shapes;
    manufacturing a second lithographic mask including said second mask level shapes; and
    manufacturing a third lithographic mask including said cut mask level shapes.

15. The method of claim 1, further comprising:
    forming a first lithographically patterned layer protecting combined areas of said first mask level shapes and said second mask level shapes over a substrate; and
    forming a second lithographically patterned layer physically exposing areas of said cut mask level shapes over said substrate.

16. An apparatus for decomposing design shapes in a design level into a plurality of target design levels, said apparatus comprising one or more processors in communication with a memory and configured to run an automated program, said automated program including steps of:
    identifying inner vertices of design shapes for a design level, said design shapes including first-type edges and second-type edges having different directions;
    pairing a subset of said inner vertices having common coordinate values;
    determining if any unmatched inner vertex is present after all inner vertices that can be paired based on common coordinate values are paired, and if present, assigning a virtual vertex for each unmatched inner vertex;

identifying each outer vertex as a first-type vertex or a second-type vertex based on presence or absence of a shared edge with said inner vertices and said at least one assigned virtual vertex, and based on whether said shared edge is a first-type edge or a second-type edge;

generating first mask level shapes for a first mask level, wherein said first mask level shapes touch said first-type vertices;

generating second mask level shapes for a second mask level, wherein said second mask level shapes touch said second-type vertices; and generating cut mask level shapes, wherein said cut mask level shapes touch each first-type edges that are not over said second mask level shapes and touch each second-type edges that are not over said second mask level shapes.

17. The apparatus of claim 16, wherein said automated program further comprises:

a first additional step of identifying each outer vertex sharing a second-type edge with any inner vertex as a first-type vertex; and a second additional step of identifying each outer vertex sharing a first-type edge with any inner vertex as a second-type vertex.

18. The apparatus of claim 17, wherein said automated program further comprises:

a third additional step of identifying each outer vertex sharing a first-type edge with a first-type vertex as another first-type vertex; and a fourth additional step of identifying each outer vertex sharing a second-type edge with a second-type vertex as another second-type vertex.

19. The apparatus of claim 18, wherein said automated program further comprises a fifth additional step of identifying any outer vertex not identified as a first-type vertex or a second-type vertex during said first additional step, said second additional step, said third additional step, and said fourth additional step as an additional first-type vertex.

20. The apparatus of claim 16, wherein said automated program is configured to perform said pairing of said subset of said inner vertices by:

pairing each first pair, if any, of inner vertices having a common Cartesian coordinate for a direction along which said second-type edges extend provided that a line connecting said first pair divides a design shape including said first pair; and pairing each second pair, if any, of inner vertices having a common Cartesian coordinate for a direction along which said first-type edges extend provided that a line connecting said second pair divides a design shape including said second pair.

* * * * *